United States Patent [19]

Masenas, Jr.

[11] 4,404,662

[45] Sep. 13, 1983

[54] METHOD AND CIRCUIT FOR ACCESSING AN INTEGRATED SEMICONDUCTOR MEMORY

[75] Inventor: Charles J. Masenas, Jr., Jericho, Vt.

[73] Assignee: International Business Machines Corporation, Armonk, N.Y.

[21] Appl. No.: 280,396

[22] Filed: Jul. 6, 1981

[51] Int. Cl.³ .............................................. G11C 11/40
[52] U.S. Cl. .................................... 365/203; 365/154
[58] Field of Search ............... 365/154, 189, 190, 202, 365/203, 233; 307/238.5

[56] References Cited

U.S. PATENT DOCUMENTS

| | | | |
|---|---|---|---|
| 3,832,699 | 8/1974 | Matsue ............................... | 365/203 |
| 4,090,255 | 5/1978 | Berger et al. ...................... | 365/154 |
| 4,158,237 | 6/1979 | Wiedmann ......................... | 365/154 |
| 4,280,198 | 7/1981 | Heuber et al. ..................... | 365/203 |
| 4,319,344 | 3/1982 | Heuber et al. ..................... | 365/203 |

Primary Examiner—Joseph A. Popek
Attorney, Agent, or Firm—Stephen J. Limanek

[57] ABSTRACT

A memory system is provided having an array of cells, each of which may include first and second cross-coupled inverting NPN transistors and first and second PNP transistors for injecting charge into the first and second inverting transistors. A first bit/sense line of a bit/sense line pair is connected to the emitter of the first inverting transistor and a second bit/sense line of the pair is connected to the emitter of the second inverting transistor and a common word line is connected to the emitters of the first and second charge injecting transistors. To read a selected cell, all cells of the array are discharged through the word lines, the pair of bit/sense lines connected to the selected cell are electrically floated or isolated and the word line connected to the selected cell is energized by a word driver. The signal developed in the bit/sense lines connected to the selected cell is detected while the word line connected to the selected cell is being energized by the word driver.

16 Claims, 2 Drawing Figures

METHOD AND CIRCUIT FOR ACCESSING AN INTEGRATED SEMICONDUCTOR MEMORY

DESCRIPTION

1. Technical Field

The invention relates to highly integrated circuits and more particularly to a method and circuit for accessing memory cells, such as, the cells of a merged transistor logic (MTL) or integrated injection logic ($I^2L$) memory array.

2. Background Art

MTL or $I^2L$ memory cells are now well known. For example, in commonly assigned U.S. Pat. No. 4,158,237, filed on July 13, 1978, by S. K. Wiedmann, there is disclosed an MTL or $I^2L$ cell which includes a flip-flop circuit having two cross-coupled bipolar switching transistors with a pair of load or injector elements, one of which is connected to the base of one of the cross-coupled transistors and to the collector of the other cross-coupled transistor and the other load or injector element is connected to the base of the other cross-coupled transistor and to the collector of the one cross-coupled transistor. The cell is controlled or accessed via a single word line connected to the cross-coupled transistors through both load or injector elements and first and second bit lines, with the first bit line being connected to the emitter of the one cross-coupled transistor and the second bit line being connected to the emitter of the other cross-coupled transistor. The cross-coupled transistors are NPN transistors and the load or injector elements are PNP transistors.

It is also known, for example, in commonly assigned U.S. patent application Ser. No. 154,640, filed May 30, 1980, by K. Heuber and S. K. Wiedmann, now U.S. Pat. No. 4,319,344, to access an MTL or $I^2L$ memory so as to provide short access and cycle times with low power dissipation. In this known memory, the unselected bit line capacitances are discharged in parallel with the selection of the word line, and the selected bit line pair is discharged toward the word line by the selected memory cell. The times for the selection operation and for the discharge operation do not add up but merely overlap, providing an accelerated read/write operation. The voltage swing of the bit line discharge is determined only by a residual voltage controlled discharge switch. For the selection of a memory cell within the array of the memory, only the bit line switching transistors are switched off in a decoded manner that are connected to the selected bit line pair. The bit line switching transistors which are connected to the non-selected bit line pairs remain conductive during the selection phase. Also, only that word line switching transistor is switched off on the word side, which is connected to the selected word line. By using decoded switching of the discharge transistors with the associated word and bit decoder circuits, the discharge transistors are decoded with less circuit complexity.

DISCLOSURE OF THE INVENTION

It is an object of this invention to provide an improved method and circuit for accessing an MTL or $I^2L$ memory having a higher speed or performance.

It is another object of this invention to provide an improved MTL or $I^2L$ memory accessing technique which is pattern insensitive.

It is still another object of this invention to provide an improved method and circuit for accessing an MTL or $I^2L$ memory having low on-chip peak currents.

It is yet another object of this invention to provide an improved method and circuit for accessing an MTL or $I^2L$ memory having access time insensitivity to cell standby current.

In accordance with the teachings of this invention, an MTL or $I^2L$ memory is provided having an array of cells, each of which includes first and second cross-coupled inverting NPN transistors and first and second PNP transistors for injecting charge into the first and second inverting transistors. A first bit/sense line is connected to the emitter of the first inverting transistor and a second bit/sense line is connected to the emitter of the second inverting transistor and a common word line is connected to the emitters of the first and second charge injecting transistors. To read a selected cell, all cells of the array are discharged through the word lines, the bit/sense lines connected to the selected cell are electrically floated or isolated and the word line connected to the selected cell is energized by a word driver. The signal developed in the bit/sense lines connected to the selected cell is detected while the word line connected to the selected cell is being energized by the word driver.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
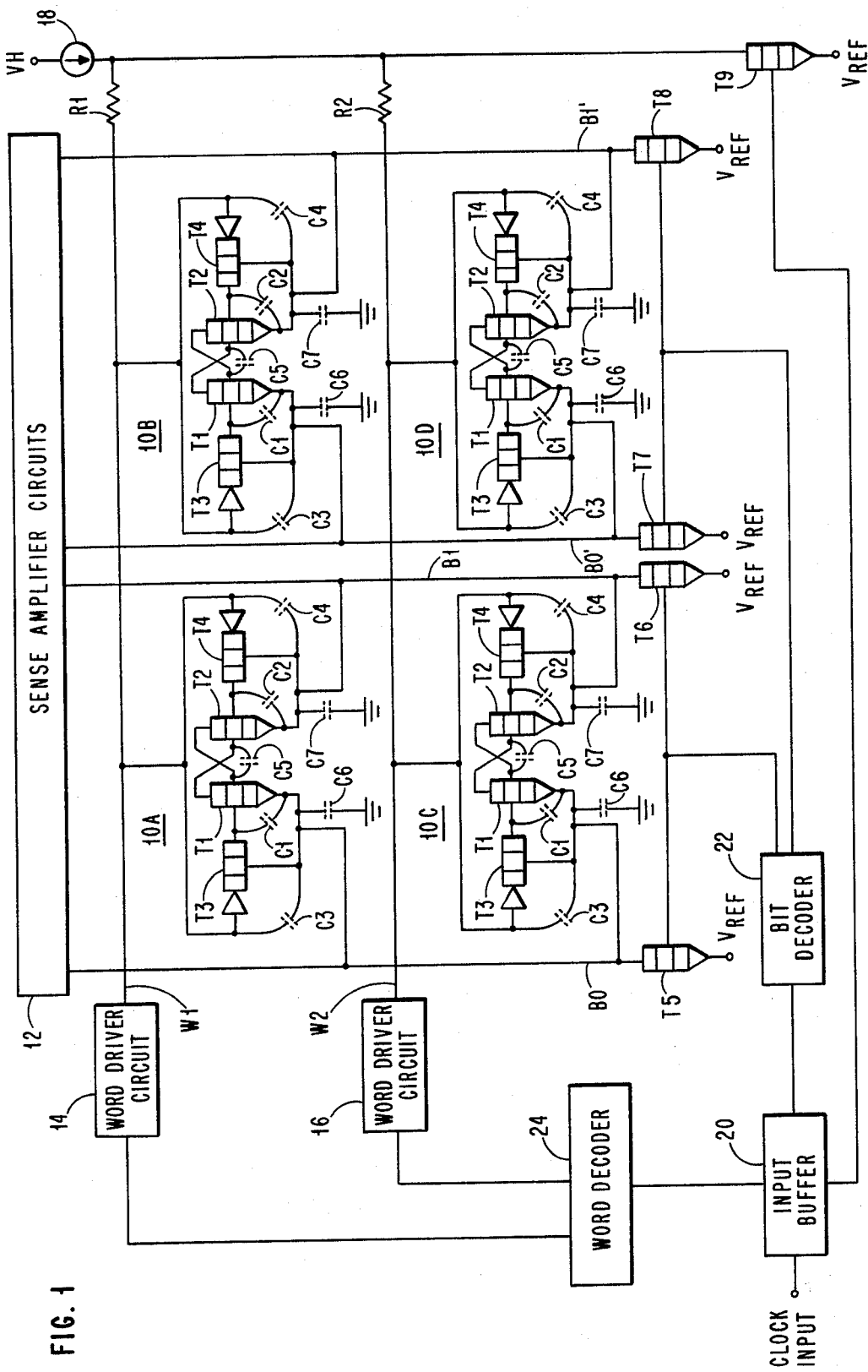
FIG. 1 is a circuit diagram, partly in block form, of the memory system of the present invention.

Referring to FIG. 1 of the drawings in more detail, there is illustrated a memory system with the accessing circuit of the present invention. The system includes an array of MTL memory cells 10A, 10B, 10C and 10D, each of which has first and second cross-coupled inverting NPN transistors T1 and T2, respectively, and first and second load or injector transistors T3 and T4, of the PNP type. The base-emitter capacitances of transistors T1, T2, T3 and T4 are indicated by C1, C2 and C3 and C4, respectively, as parasitic capacitors. The base-collector capacitance of transistors T1 and T2 is indicated by C5. The PNP transistor T3 has its collector connected to the base of the NPN transistor T1 and the PNP transistor T4 has its collector connected to the base of the NPN transistor T2, with the base of the transistor T3 being connected to the emitter of the transistor T1 and the base of the transistor T4 being connected to the emitter of the transistor T2. As is known, e.g., in the hereinabove referenced Wiedmann patent, a first common region in a semiconductor substrate forms the collector of the transistor T3 and the base of the transistor T1, a second common region forms the base of the transistor T3 and the emitter of the transistor T1, a third common region forms the collector of the transistor T4 and the base of the transistor T2 and a fourth common region forms the base of the transistor T4 and the emitter of the transistor T2.

First and second bit/sense lines B0 and B1 are connected to the cells 10A and 10C, with the bit/sense line B0 being connected to the emitters of the transistors T1 and the bit/sense line B1 being connected to the emitters of the transistors T2. Third and fourth bit/sense lines B0' and B1' are connected to the cells 10B and 10D, with the bit/sense line B0' being connected to the emitters of the transistors T1 and the bit/sense line B1' being connected to the emitters of the transistors T2. Substrate isolation or bit/sense line capacitances are indicated at C6 and C7, with capacitors C6 being connected to the emitters of the transistors T1 and capacitors C7 being connected to the emitters of the transistors T2. The capacitors C6 and C7 are tied to ground or to the semiconductor substrate, which is at the most negative potential of the system. A first word line W1 is connected to the emitters of the PNP transistors T3 and T4 of the cells 10A and 10B and a second word line W2 is connected to the emitters of the PNP transistors T3 and T4 of the cells 10C and 10D.

Sense amplifier circuits 12, of a known type, are connected to the first and second bit/sense lines B0 and B1 and to the third and fourth bit/sense lines B0' and B1'. Also connected to the first and second bit/sense lines B0 and B1 are first and second bit switch transistors T5 and T6, respectively, and to the third and fourth bit/sense lines B0' and B1' are third and fouth bit switch transistors T7 and T8, respectively. The bit/sense lines B0, B1, B0' and B1' are connected more specifically to the collectors of transistors T5-T8, respectively, with their emitters being connected to a point of reference potential, $V_{REF}$, preferably $+1.6$ volts. A first word driver 14, of a known type, is connected to one end of the first word line W1 and a second word driver 16, also of a known type, is connected to one end of the second word line W2. The other ends of the first and second word lines W1 and W2 are connected through first and second resistors R1 and R2, respectively, each, e.g., of 1.5 K ohms, to an array discharge transistor T9 of the NPN type, having its emitter connected to the point of reference potential $V_{REF}$, which is preferably at $+1.6$ volts. If desired, the resistors R1 and R2 may be replaced by suitably biased transistors. A standby current source 18 connected to a power supply VH having a voltage of, e.g., $+5$ volts, is connected to the first and second word lines W1 and W2 through the first and second resistors R1 and R2, respectively.

An input buffer 20 having a clock input produces pulses for controlling bit decoder 22 and word decoder 24, as well as the array discharge transistor T9. Input buffer 20, bit decoder 22 and word decoder 24 may include any known appropriate circuits. As is also known, appropriate address lines, not shown, are connected to the bit decoder 22 having outputs connected to the bases of transistors T5-T8 and to the word decoder 24 having outputs connected to the word driver circuits 14 and 16 for selecting one or more of the desired cells, 10A, 10B, 10C and 10D.

Figure 2:
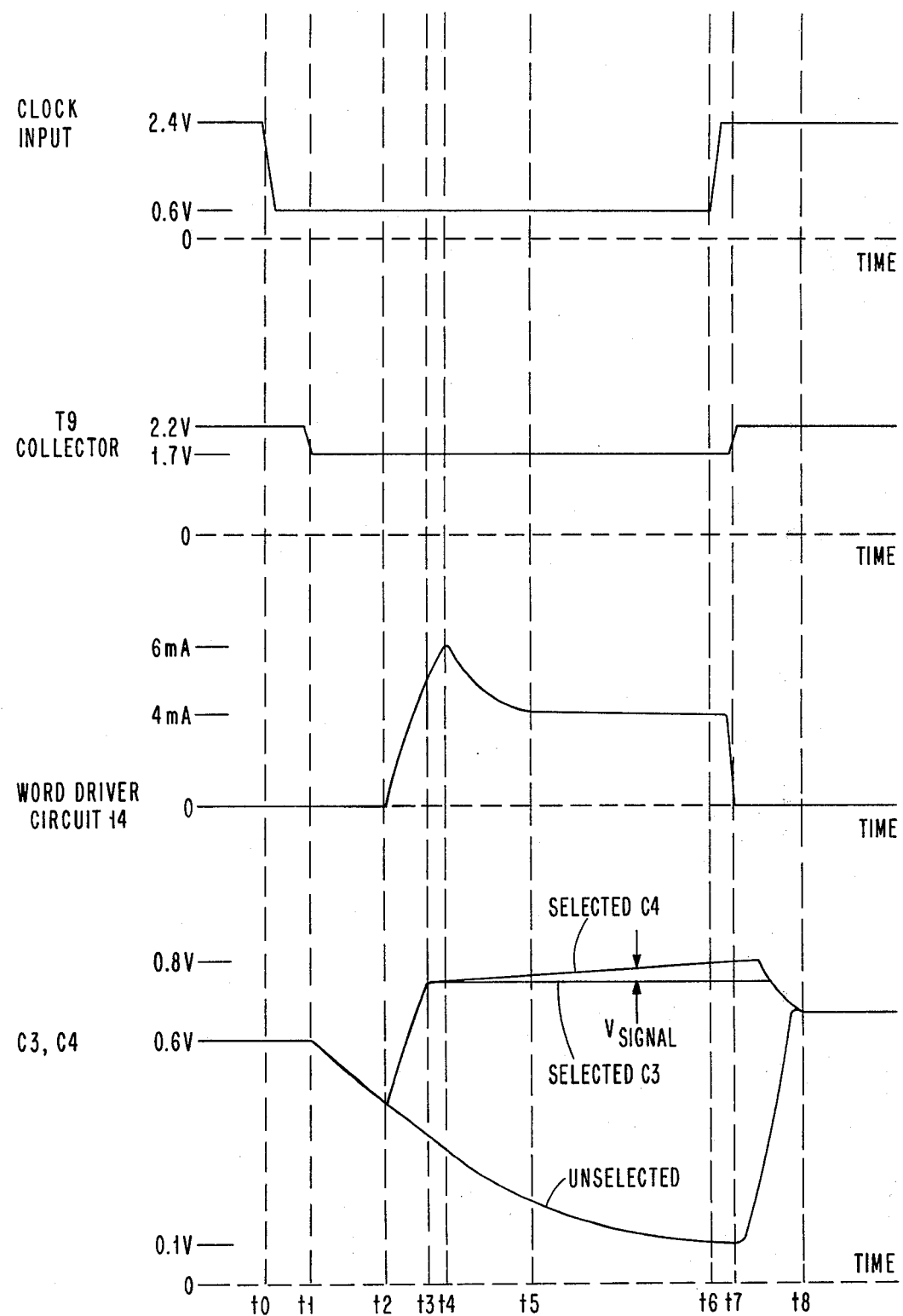
FIG. 2 is a pulse program which may be used to operate the system of FIG. 1 of the drawings.

In order to better understand the operation, particularly the read cycle, of the system of FIG. 1 of the drawings, reference may be had to the pulse program indicated in FIG. 2 of the drawings. Prior to time t0, as indicated in FIG. 2, when the system is in standby, the clock input is up at 2.4 volts and the voltage at the collector of the array discharge transistor T9 is at 2.2 volts, with a standby current of 0.2 microamperes flowing through each cell of the array. No current is produced at the outputs of the word drivers 14 and 16 and each of the bit/sense lines B0, B1, B0' and B1' is held at approximately 1.6 volts with saturated bit switch transistors T5-T8. Thus, it can be seen that in standby the voltage difference between the word lines and the bit/sense lines or across capacitors C3 and C4, is equal to 0.6 volts with one of the two cross-coupled NPN transistors of each memory cell being in an on condition and the other being in an off condition. It is assumed that when transistor T1 is on and transistor T2 of the same cell is off, a 1 digit of binary information is stored in that cell, and when transistor T1 is off and transistor T2 is on, a 0 digit is stored.

When the clock input pulse at the input buffer 20 drops to 0.6 volts at time t0 in FIG. 2, the bit decoder 22 and the word decoder 24 are enabled and the array discharge transistor T9 is turned on dropping the voltage at the collector of the transistor T9 to approximately 1.7 volts at time t1. With transistor T9 turned on, the current source 18 no longer supplies current to the word lines W1 and W2 and, therefore, the voltage across the capacitors C3 and C4 begins to decrease, as indicated in FIG. 2 between times t1 and t2, with the rate of decrease being determined by the RC time constant of the circuit.

Assuming that the addresses applied to the bit decoder 22 and the word decoder 24 after the decoders were enabled selected the first and second bit/sense lines B0 and B1, and the first word line W1, cell 10A would be in condition to have the information stored therein read out. When cell 10A is to be read, the word driver circuit 14 produces a high current in the first word line W1 beginning at time t2, as indicated in FIG. 2, while the first and second bit/sense lines B0 and B1 are floating. With the high current produced on the first word line W1, the voltage across capacitors C3 and C4 in each of the cells 10A and 10B rises rapidly. However, since the selected bit/sense lines B0 and B1 are floating, they discharge through the unselected cells, such as cell 10C, connected to the selected bit/sense lines B0 and B1 and cause the capacitors C3 and C4 to become more highly charged than the unselected cells whose bit lines remain at a fixed potential, i.e., at $V_{REF}$, or $+1.6$ volts.

At time t3, capacitors C3 and C4 become substantially fully charged with current flowing through the injector transistors T3 and T4 of all of the cells of the first word line W1, and at time t4 the current from the suitably designed word driver circuit 14 reaches its peak of about 6 milliamperes and then reduces at time t5 to a steady state condition at about 4 milliamperes. With the transistor T1 in an on condition, representing a 1 digit of binary information, the current fed into the bit/sense line B0 is approximately 85 microamperes, current fed into the bit/sense line B1 being approximately 16 microamperes, producing a higher voltage on the bit/sense line B0 than on the bit/sense line B1. The difference in voltage on the bit/sense lines B0 and B1 can be readily detected by a differential amplifier, at say, 6 millivolts, with this differential voltage quickly attaining a magnitude of 30 or more millivolts prior to time t7.

Since current is not supplied to the unselected word lines, such as line W2, the voltage across capacitors C3 and C4 of the unselected cells, e.g. 10C and 10D continues to decrease, as indicated in FIG. 2 of the drawings between times t2 and t7 until the voltage across the capacitors C3 and C4 reaches a low value of about 0.1 volts. At this point, the information stored in the unselected cells is maintained by the charge on the internal capacitors C1, C2 and C5.

After the selected cell 10A has been read, the clock input pulse is increased to 2.4 volts at time t6 disengaging to bit decoder 22 and the word decoder 24 and turning off the array discharge transistor T9 at time t7, as well as returning the selected bit/sense lines B0 and B1 to the voltage $V_{REF}$. With the word decoder 24 turned off, current is no longer produced by the word driver circuit 14 and the standby current source 18 begins to again supply current to the word lines W1 and W2 through the resistors R1 and R2, respectively, to restore the circuit to the standby condition at time t8. To more rapidly restore the cells to the standby condition, a high current pulse may be produced on the word lines W1 and W2 by any suitable means, which may be associated with the standby current source 18. To write information into the cell 10A, e.g., to write a 0 digit of binary information, current is supplied to the first word line W1, the bit switch transistors T5 and T6 are opened and the bit/sense line B0 voltage is then raised by, e.g. 200 millivolts, with the unselected word lines being discharged as described hereinabove in connection with the read cycle.

It should be understood that any of the other cells 10B, 10C or 10D may be selected and operated in a similar manner.

It should be noted that in accordance with the teachings of this invention, the access time for the read cycle is substantially reduced, by approximately 20%, since the cells of the array are discharged through the word lines while the bit and word decoders 22 and 24 have applied thereto the address pulses for selecting or decoding the word and bit lines during time period t0 to t2. Furthermore, since the unselected cells on the selected bit lines have been discharged through the unselected word lines, i.e., turned off, the system is not pattern sensitive, i.e., the sense amplifier detects only the signal produced on the selected pair of bit/sense lines by the selected cell without being influenced by the signals stored in the other cells of the array.

It should also be noted that, although a four cell array having two word lines and two pairs of bit/sense lines has been illustrated for purposes of clarity, in practice 10,000 or more cells are used with 100 or more word lines and 100 or more pairs of bit/sense lines.

While the invention has been particularly shown and described with reference to preferred embodiments thereof, it will be understood by those skilled in the art that various changes in form and detail may be made therein without departing from the spirit and scope of the invention.

What is claimed is:

1. A merged transistor logic memory comprising
an array of memory cells arranged in a plurality of columns and rows and having a plurality of word lines, each connected to a respective row of said cells, and a plurality of bit/sense lines, each connected to a respective column of said cells,
means for selecting one of said plurality of word lines and one of said plurality of bit/sense lines having a given cell coupled thereto,
means for changing the voltage on said one word line in a given direction to establish a voltage of a first magnitude during a given period of time,
means for changing the voltage on the remaining word lines of said plurality of word lines in a direction opposite to that of said given direction to establish a voltage of a second magnitude during said given period of time,
means for electrically floating said one bit/sense line during said given period of time, and
means for detecting a signal on said one bit/sense line during said given period of time.

2. A memory system comprising
a plurality of cells arranged in a plurality of columns and in a plurality of rows,
a plurality of word lines, each connected to a respective row of said cells,
a plurality of pairs of bit/sense lines, each connected to a respective column of said cells,
means for discharging said word lines,
means for selecting one of said word lines and one of said pairs of bit/sense lines having a given cell coupled thereto,
means for electrically floating said one pair of bit/sense lines of said plurality of pairs of bit/sense lines during a given period of time,
means for energizing said one word line of said plurality of word lines to charge said given cell during said given period of time, and
means for detecting a signal between said one pair of bit/sense lines during said given period of time when said given cell is being charged and the remaining cells connected to said one pair of bit/sense lines are being discharged.

3. A memory system as set forth in claim 2 wherein said discharging means includes a discharge transistor and a plurality of impedance elements, each of said impedance elements being connected between said transistor and a respective one of said plurality of word lines.

4. A memory system as set forth in claim 3 wherein said plurality of impedance elements includes a plurality of resistors.

5. A memory system as set forth in claim 2 wherein said means for electrically floating includes a plurality of transistors, each of the transistors of said plurality of transistors being connected between a point of reference potential and a respective one of said bit/sense lines.

6. A memory system as set forth in claim 5 wherein said discharging means includes a discharge transistor connected between said point of reference potential and said plurality of word lines, and said selecting means includes a word decoder connected to said energizing means, a bit decoder connected to control electrodes of said plurality of transistors and an input buffer connected to said word and bit decoders and to a control electrode of said discharge transistor.

7. A memory system as set forth in claim 2 wherein said energizing means includes a circuit for producing a current during a given period of time with a higher current being produced at an early portion of said given period of time than the current produced during a latter portion of said given period of time.

8. A memory system as set forth in claim 7 wherein said energizing means includes a word driver circuit connected to said one word line.

9. A memory system as set forth in claim 2 wherein said detecting means includes a differential sense amplifier connected to said selected pair of bit/sense lines.

10. A memory system comprising
a plurality of cells arranged in a plurality of columns and in a plurality of rows,
a plurality of word lines, each connected to a respective row of said cells, a plurality of pairs of bit/sense lines, each connected to a respective column of said cells, each of said cells including first and second cross-coupled transistors, a first injector connected to said first transistor and a second injector connected to said second transistor, said first and second injectors being interconnected and connected to a respective one of said plurality of word lines, an emitter of said first transistor being connected to one bit/sense line of a respective pair of said plurality of bit/sense lines and an emitter of said second transistor being connected to the other bit/sense lines of said respective pair of said plurality of bit/sense lines, means including a discharge transistor connected between said point of reference potential and said plurality of word lines for discharging said word lines, means including a plurality of transistors, each of the transistors of said plurality of transistors being connected between a point of reference potential and a respective one of said bit/sense lines for electrically floating a selected pair of bit/sense lines of said plurality of pairs of bit/sense lines and for maintaining the remaining pairs of said bit/sense lines at a point of reference potential, means for energizing a selected word line of said plurality of word lines, a word decoder connected to said energizing means, a bit decoder connected to control electrodes of said plurality of transistors, an input buffer connected to said word and bit decoders and to a control electrode of said discharge transistor, and means for detecting a signal between said selected pair of bit/sense lines.

11. A memory system as set forth in claim 10 further including means for supplying a standby current to each of said cells.

12. A memory system as set forth in claim 11 wherein said discharging means includes a plurality of impedance elements, each of which is connected between said standby current supply means and a respective one of said plurality of word lines.

13. A memory system as set forth in claim 12 wherein said plurality of impedance elements includes a plurality of resistors.

14. A method of reading a selected cell of an array of memory cells arranged in a plurality of columns and rows and having a plurality of word lines, each connected to a respective row of said cells, and a plurality of pairs of bit/sense lines, each pair being connected to a respective column of said cells, said selected cell being connected to one of said plurality of word lines and to one of said plurality of pairs of bit/sense lines, comprising the steps of discharging each of said plurality of word lines, discharging the voltage on said one pair of bit/sense lines through the unselected cells of said one pair of bit/sense lines, supplying current through said selected cell to said one pair of bit/sense lines during a given period of time, and detecting the voltage difference between the lines of said pair of bit/sense lines during said given period of time.

15. A method as set forth in claim 14 wherein said current supplied during said given period of time has a higher value during an early portion of said period than during a later portion of said period.

16. A method as set forth in claim 15 wherein said discharging, supplying and detecting is performed simultaneously within said given period of time.

* * * * *